United States Patent [19]

Kuwabara et al.

[11] Patent Number: 5,231,263
[45] Date of Patent: Jul. 27, 1993

[54] LIQUID CRYSTAL MASK TYPE LASER MARKING SYSTEM

[75] Inventors: Kouji Kuwabara, Hitachi; Tadashi Sato; Makoto Yano, both of Mito, all of Japan

[73] Assignee: Hitachi, Ltd., Tokyo, Japan

[21] Appl. No.: 666,848

[22] Filed: Mar. 8, 1991

[30] Foreign Application Priority Data

Mar. 9, 1990 [JP] Japan ................................. 2-056374

[51] Int. Cl.$^5$ .............................................. B23K 26/00
[52] U.S. Cl. ............................. 219/121.68; 219/121.73
[58] Field of Search .................... 219/121.68, 121.69, 219/121.84, 121.77, 121.6, 121.85; 346/76 L; 356/301, 310; 359/67

[56] References Cited

U.S. PATENT DOCUMENTS 4,818,835 4/1989 Kuwabara et al. ............... 219/121.6

4,856,897 8/1989 Fateley et al. ..................... 356/301

FOREIGN PATENT DOCUMENTS 11088 1/1989 Japan .

Primary Examiner—C. L. Albritton
Attorney, Agent, or Firm—Antonelli, Terry, Stout & Kraus

[57] ABSTRACT

Disclosed is a liquid crystal mask type laser marking system for transferring a pattern information onto an object to be worked. A laser beam emitted from a laser oscillator is applied to a liquid crystal mask having a pattern mask. The laser beam outgoing from the liquid crystal mask is applied to a wavelength converter, which converts the laser beam to one having a wavelength to which the object to be worked is sensitive. The converted laser beam is applied to the object to be worked.

34 Claims, 4 Drawing Sheets

LIQUID CRYSTAL MASK TYPE LASER MARKING SYSTEM

BACKGROUND OF THE INVENTION

1. Field of the Invention

This invention relates to a liquid crystal mask type laser marking system for transferring pattern information onto an object to be worked.

2. Description of the Prior Art

Electric parts such as semiconductor devices or resistors are surrounded by insulating layers consisting of synthetic resin coating. Affixed to such an insulating layer is a pattern information in the form of a manufacturer's label, a production number, etc. Such pattern information has to be varied depending on the type of the electric part, manufacturing date, etc. Recently, a liquid crystal mask type laser marking system in which a pattern information can be changed from the outside has been getting attention. Examples of such marking system are disclosed in Japanese Patent Unexamined Publication No. 64-11088 (which corresponds to U.S. Pat. No. 4,818,835) and No. 2-165880.

A liquid crystal mask type laser marking device is designed to apply a laser beam to a liquid-crystal mask consisting of liquid crystal elements having a pattern information controllable from the outside. The laser beam passes through the liquid crystal mask to reach an object to be worked and partly evaporates the object with heat, thereby impressing the pattern information on the object.

In some electronic parts, such as printed boards or liquid crystal cells, an electric circuit is formed on a board by applying a photoresist to the surface of the board, exposing the photoresist to ultraviolet rays to effect development, and performing etching thereon. In the production of such electronic parts, the prior art laser marking techniques cannot be adopted for the following reasons:

1) The wavelength to which the photoresist is sensitive does not coincide with the wavelength of the infrared laser beam or the visible laser beam emitted from a laser oscillator. That is, the photoresist is not sensitive to the infrared or the visible laser beam.

2) If a laser beam having a wavelength to which the photoresist is sensitive, for example, a laser beam in the ultraviolet region, is irradiated to the liquid crystal mask, the liquid crystal molecules in the mask will decompose.

SUMMARY OF THE INVENTION

It is the object of this invention to provide a liquid crystal mask type laser marking system for transferring a pattern information contained in a liquid crystal mask to an object to be worked by irradiating a laser beam onto a liquid crystal patterned mask and applying the beam transmitted through this mask to the object, wherein the wavelength of the laser beam transmitted through the liquid crystal mask is selected such that the liquid crystal mask is not damaged thereby and wherein the wavelength of the laser beam from the liquid crystal mask is converted to one to which the object to be worked is sensitive so that the pattern information can be transferred thereto.

In accordance with an embodiment of this invention, there is provided a liquid crystal mask type laser marking system comprising a laser oscillator adapted to emit an infrared or a visible laser beam; a liquid crystal mask which has a pattern mask and to which the laser beam from the laser oscillator is applied; and a wavelength converter for converting the laser beam outgoing from the liquid crystal mask to one having a wavelength to which the object to be worked is sensitive, and for applying the converted laser beam to the object to be worked.

A focusing lens may be disposed between the wavelength converter and the object to be worked. Further, a condenser lens may be disposed between the liquid crystal mask and the wavelength converter.

In accordance with another embodiment of this invention, there is provided a liquid crystal mask type laser marking system comprising a laser oscillator adapted to emit an ultraviolet laser beam, a first wavelength converter for converting the ultraviolet laser beam from this laser oscillator to a visible laser beam, a liquid crystal mask to which the visible laser beam from the first wavelength converter is applied, and a second wavelength converter for converting the laser beam from this liquid crystal mask to an ultraviolet laser beam and for applying the converted laser beam to the object to be worked.

The laser oscillator for emitting an ultraviolet laser beam may be an excimer laser oscillator.

In accordance with still another embodiment of this invention, there is provided a liquid crystal mask type laser marking system which includes a control unit which causes a pattern information to be displayed on a liquid crystal mask and which, after the display, causes a laser beam from a laser oscillator to be applied to the liquid crystal mask.

In accordance with a further embodiment of this invention, there is provided a liquid crystal mask type laser marking system comprising a container in which the object to be worked is disposed and which is filled with a reactive gas, and a wavelength converter which converts a laser beam transmitted through a liquid crystal mask to an ultraviolet laser beam and which irradiates the inside of the container with the ultraviolet laser beam, whereby pattern information is transferred to the object to be worked by means of a substance generated through a reaction between the ultraviolet laser beam and the reactive gas.

In accordance with a still further embodiment of this invention, there is provided a liquid crystal mask type laser marking system wherein a wavelength converter consisting of non-linear optical elements is directionally arranged with respect to a liquid crystal mask in such a manner that, when a laser beam outgoing from this liquid crystal mask and having two polarizing directions which are perpendicular to each other is applied to the wavelength converter, the two polarizing directions of this laser beam are at fixed angles to the optical axis of the non-linear elements constituting the wavelength converter, thereby satisfying the conditions of the phase matching of the second kind.

As described above, each of the embodiments of the liquid crystal mask type laser marking system of the present invention is so designed that, after a beam of light has passed through a liquid crystal mask having pattern information, the light is converted to one having a wavelength to which the object to be worked is sensitive. Thus, the system can utilize a light having a wavelength which does not damage the liquid crystal.

In accordance with this invention, therefore, a clear pattern information can be transferred to the object to be worked without damaging the liquid crystal mask.

The above and other objects, features and advantages of this invention will become more apparent from the description below.

DESCRIPTION OF THE PREFERRED EMBODIMENTS

Figure 1:
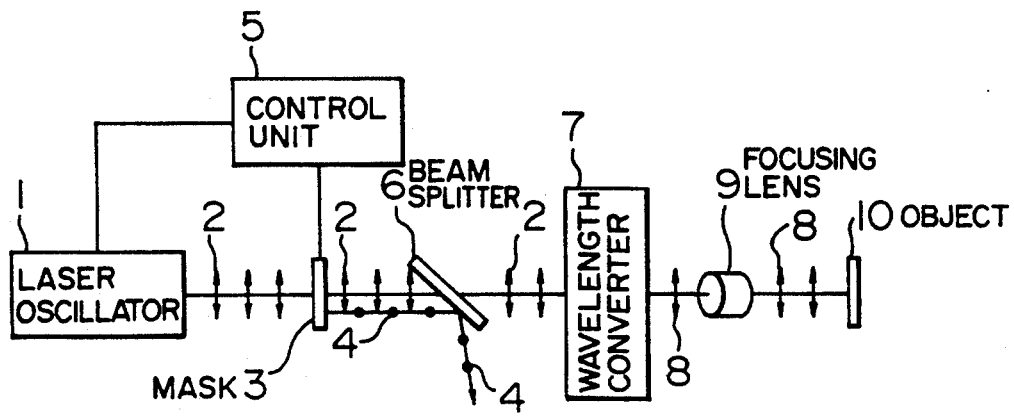
FIG. 1 is a schematic view showing the structure of a liquid crystal mask type laser marking system in accordance with an embodiment of this invention.

In the embodiment of this invention shown in FIG. 1, a linear polarized laser beam 2 (e.g., a P-polarized one) from a laser oscillator 1 adapted to emit an infrared or a visible laser beam is applied to a liquid crystal patterned mask 3. Then, while the polarizing direction of that portion of the laser beam passing through the mask portion corresponding to the pattern to be impressed remains unchanged, the polarizing direction of that portion of the laser beam passing through the mask portion corresponding to the background is changed, with the result that the beam corresponding to the background becomes an S-polarized laser beam 4. A control unit 5 causes the pattern information to be displayed on the liquid crystal mask 3 and controls the laser oscillator 1 and the liquid crystal mask 3 in such a manner that, after the display, the laser beam 2 from the laser oscillator 1 is applied to the liquid crystal mask 3. A beam splitter 6 serves to separate the P-polarized laser beam 2 and the S-polarized laser beam 4 from each other. Thus, it is only the P-polarized laser beam 2 that is transmitted through the beam splitter 6. This laser beam 2, which corresponds to the pattern to be impressed, is converted to a laser beam having a wavelength to which the object 10 to be worked is sensitive, for example, to an ultraviolet laser beam 8, by means of a wavelength converter 7. This ultraviolet laser beam 8 passes through a focusing lens 9 to transfer the pattern to the surface of the object 10 which is sensitive to an ultraviolet laser beam but not to an infrared or a visible laser beam.

Next, the operation of the wavelength converter 7 will be described. By way of example, a case will be described where the laser oscillator 1 generates an Nd:YAG laser and the object 10 to be worked is a printed board 11.

Figure 2A:
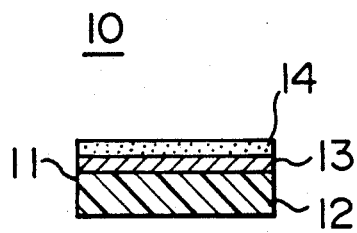
FIG. 2A is a sectional side elevation of a printed board.
Figure 3:
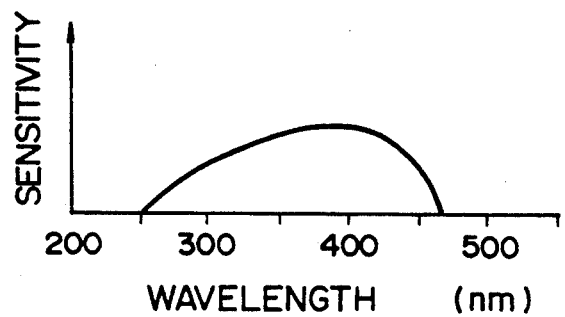
FIG. 3 is a graph showing the spectral sensitivity characteristics of a photoresist.

The wavelength of the Nd:YAG laser is 1064 nm. As shown in FIG. 2A, the printed board 11 comprises a resin substrate 12, a copper plate 13 laminated on the substrate and a photoresist 14 applied to the surface of the copper plate. The photoresist 14 may be selected from a variety of types. It may, for example, be the photosensitive polyimide, Photo-PAL (a registered trademark) manufactured by Hitachi Chemical Co., Ltd., which has the spectral sensitivity characteristic shown in FIG. 3 and is photosensitive to a wavelength within the range of 250 to 460 nm. Accordingly, if an Nd:YAG laser beam is directly applied to the photoresist 14, the portion thereof corresponding to the pattern to be impressed cannot be exposed.

Figure 2B:
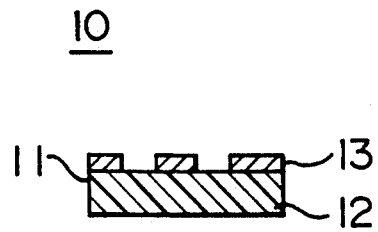
FIG. 2B is a sectional side elevation of a printed board on which photoetching has been performed.

In view of the problem referred to above, the present invention employs a wavelength converter 7 which consists, for example, of a combination of non-linear crystals of KTP ($KTiOPO_4$) and BBO ($\beta$-$BaB_2O_4$), which are wavelength conversion elements for the Nd:YAG laser. By this wavelength converter, the laser wavelength is first converted from 1064 nm to 532.1 nm and then to 354.7 nm, thereby enabling the above photoresist 14 to be exposed. The printed board 11 thus exposed is subjected to processes such as etching, and, as shown in FIG. 2B, so that only those portions of the copper plate 13 which have been irradiated with the ultraviolet laser beam 8 (the portions corresponding to the pattern to be impressed) remain on the substrate, thus completing a clear pattern impression.

Any portion of the laser beam 2 whose wavelength has not been converted by the wavelength converter 7 may be detected by a filter (not shown) which can be disposed on the output side of the wavelength converter 7, thereby improving the clearness of the impressed pattern.

A description will be made of the polarizing directions of the laser beam incident upon the wavelength converter 7.

The characteristic of the non-linear optical crystals constituting the wavelength converter 7 is such that, if the polarizing directions of the incident laser beam are so selected as to be at determined angles to the optical axis of these crystals, the efficiency in wavelength conversion is enhanced. This characteristic is called "phase matching."

There are two kinds of "angular phase matching": The first kind causes a laser beam having a single polarization component to be at a determined angle with respect to the optical axis of the non-linear optical crystals as mentioned above; The second kind, which is for a laser beam having polarizing directions that are perpendicular to each other, causes the polarizing directions of such laser beam to be respectively at determined angles with respect to the optical axis of the non-linear optical crystals as mentioned above.

The phase matching of the second kind provides a wavelength conversion efficiency higher than that of the first kind.

In the case of the KTP crystals mentioned above, for example, the angular phase matching of the second kind provides a conversion efficiency one digit higher than that of the first kind.

In the prior-art techniques, the phase matching of the second kind has been achieved by applying two laser beams, each having a single or unitary polarizing component, to non-linear optical crystals in such a manner that, within the non-linear crystals, these beams become two polarizing components which are perpendicular to each other.

However, as described with reference to the embodiment shown in FIG. 1, the laser beams 2 and 4 outgoing from the liquid crystal mask 3 have polarizing directions which are perpendicular to each other. Accordingly, the phase matching of the second kind can be achieved by directly applying the laser beams 2 and 4, having polarizing directions perpendicular to each other, to the wavelength converter 7, other than separating the laser beam 4 by the beam splitter 6 in the manner shown in FIG. 1. Such arrangement is embodied in the embodiment of the liquid crystal mask type laser marking system shown in FIG. 1A. Since the reference numerals in FIG. 1A which are identical to those in FIG. 1 indicate the same or equivalent parts, only those features of the embodiment of FIG. 1A which have not been described with reference to FIG. 1 will be described hereunder.

Figure 1A:
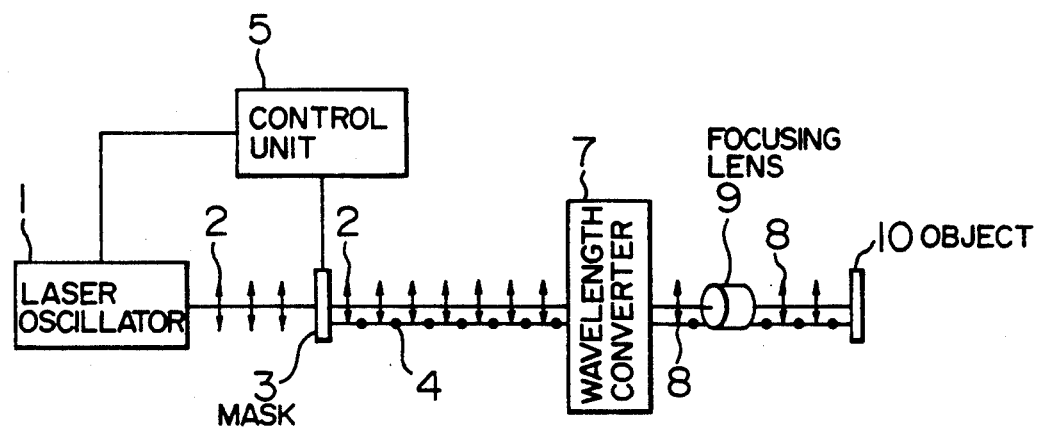
FIG. 1A is a schematic view showing the structure of a system in accordance with another embodiment of this invention.

In the embodiment shown in FIG. 1A, the laser beams 2 and 4, having polarizing direction perpendicular to each other, are applied to the wavelength converter 7 in such a manner that their polarizing directions are respectively at determined angles to the optical axis of the non-linear optical crystals constituting the wavelength converter 7, thus effecting the angular phase matching of the second kind.

In accordance with the embodiment shown in FIG. 1A, the wavelength converter 7 can enhance the conversion efficiency with respect to the laser beam 2 by utilizing the part of the laser beam 4 (which constitutes 60 to 70% of the incident laser beam, depending on the pattern), which has been eliminated in the embodiment of FIG. 1 as an unnecessary beam portion. Since the wavelength conversion efficiency is not 100%, some unconverted laser beam portion is allowed to strike upon the object 10 to be worked. The object 10, however, is not sensitive to this beam portion.

A liquid crystal material, which is an organic substance, exhibits a high absorption factor in the ultraviolet range. Accordingly, if the ultraviolet laser beam 8 (having a wavelength of 354.7 nm) obtained through wavelength conversion is directly applied to the liquid crystal mask 3, the liquid crystal molecules in the liquid crystal mask decompose. Thus, the mask cannot withstand repeated use. In the embodiments of this invention, a laser beam 2 emitted from an Nd:YAG laser oscillator 1, which does not decompose liquid crystal materials, is transmitted through the liquid crystal mask 3. The beam is then wavelength-converted into an ultraviolet beam 8 before it is applied to the object 10 to be worked. Accordingly, there is no such risk as mentioned above, so that the liquid crystal mask type laser marking system of the invention provides a stable marking performance for a long period.

Next, still another embodiment of this invention will be described with reference to FIGS. 4 to 7.

In the description below, the same reference numerals as those used in FIG. 1 indicate the same or equivalent components as those of the system shown in FIG. 1.

Figure 4:
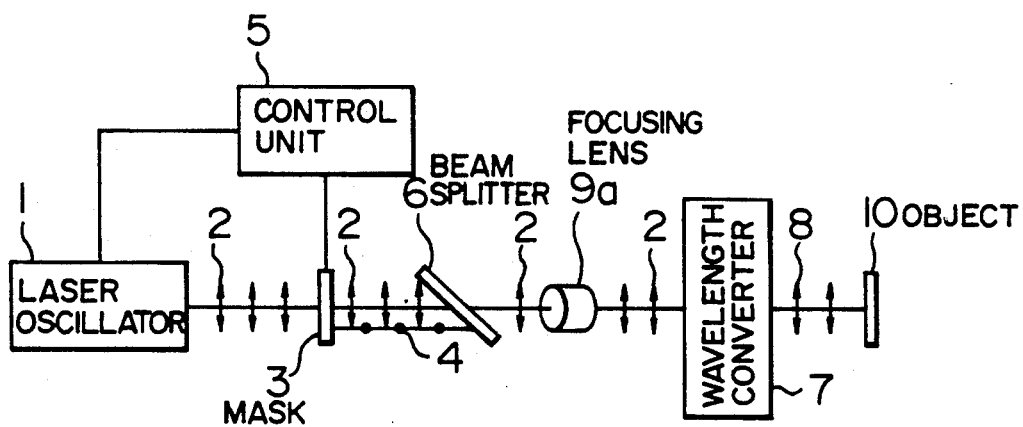
FIGS. 4, 4A, 5 through 7 are schematic views showing the structures of other embodiments of this invention.

The embodiment shown in FIG. 4 differs from that of FIG. 1 in that a focusing lens 9a for forming an image from the laser beam from the liquid crystal mask 3 is provided such that the wavelength converter 7 is positioned in the vicinity of the focus of this focusing lens 9a.

By thus arranging the wavelength converter 7 in the vicinity of the focus of the focusing lens 9a, the intensity of the laser power is heightened in the wavelength converter 7 whereby the efficiency in the wavelength conversion is enhanced.

Figure 4A:
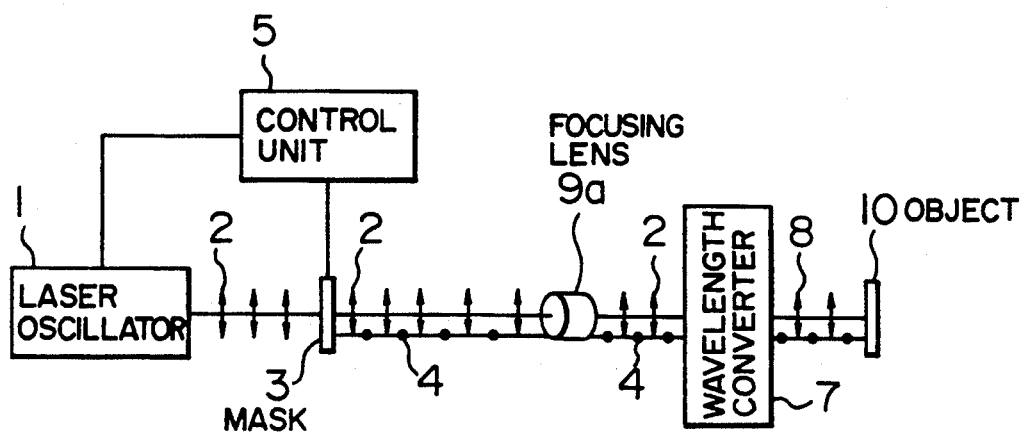

Unlike the embodiment of FIG. 4, the embodiment shown in FIG. 4A does not employ the beam splitter 6. The laser beams 2 and 4, whose respective polarizing directions are perpendicular to each other, are allowed to directly strike upon the wavelength converter 7, and, as in the embodiment of FIG. 1A, effects the angular phase matching of the second kind. That is, the wavelength converter 7 is directionally arranged with respect to the liquid crystal mask 3 in such a manner that the respective polarizing directions of the laser beams 2 and 4 are respectively at determined angles with respect to the optical axis of the non-linear optical crystals constituting the wavelength converter 7. As explained with reference to the embodiment of FIG. 1A, the above arrangement is effective to enhance the wavelength conversion efficiency for the laser beam 2.

Figure 5:
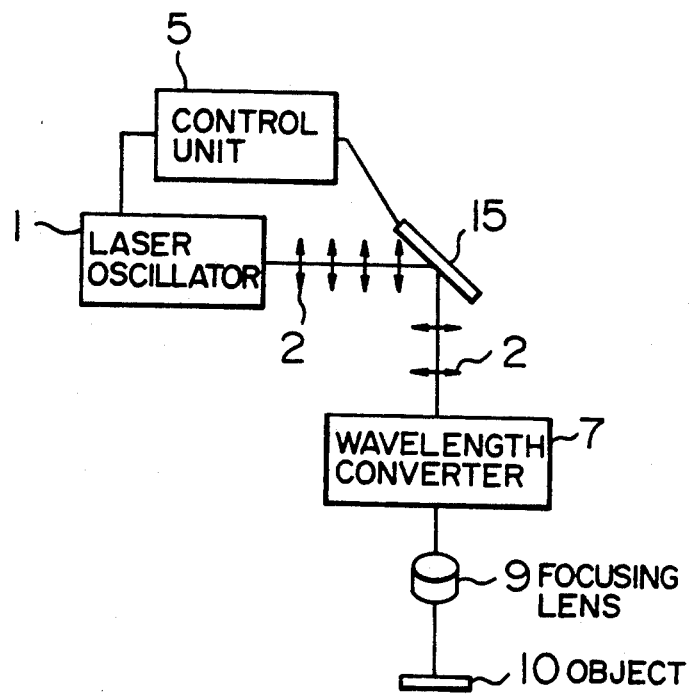

The embodiment shown in FIG. 5 utilizes a reflection type liquid crystal mask 15, which is advantageous in that the mask allows the direction of the optical path of the laser beam to be changed as desired.

Figure 6:
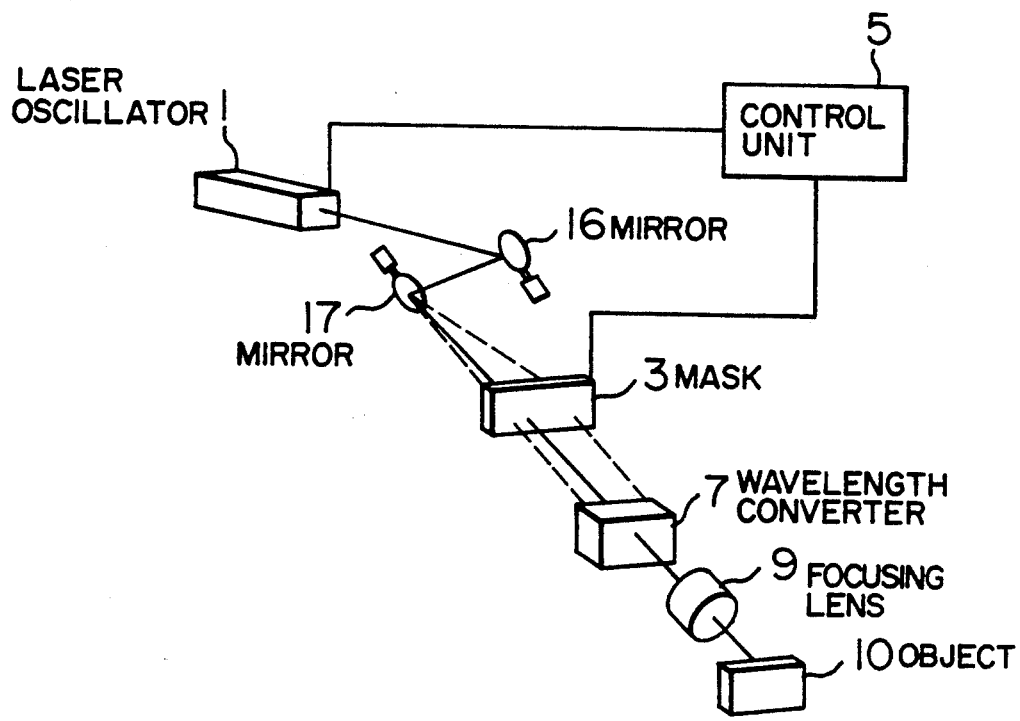

In the embodiment shown in FIG. 6, scanning mirrors 16 and 17 are used to scan the liquid crystal mask 3 with a laser beam. With this construction, the marking operation can be performed over a wide range by means of a laser oscillator 1 having a relatively small power output.

While, in the above embodiments, an Nd:YAG laser has been used in combination with KTP and BBO which serve as the wavelength conversion elements, it is also possible to utilize other types of laser, such as alexandrite laser, ruby laser, or argon laser. Further, wavelength conversion elements of an organic material may be used for the wave length converter.

When an excimer laser oscillator is used, it is necessary to provide in the incidence side of the optical path of the liquid crystal mask a first wavelength converter adapted to convert an ultraviolet beam to a visible beam. This is because of the fact that an excimer laser beam is an ultraviolet beam.

Figure 7:
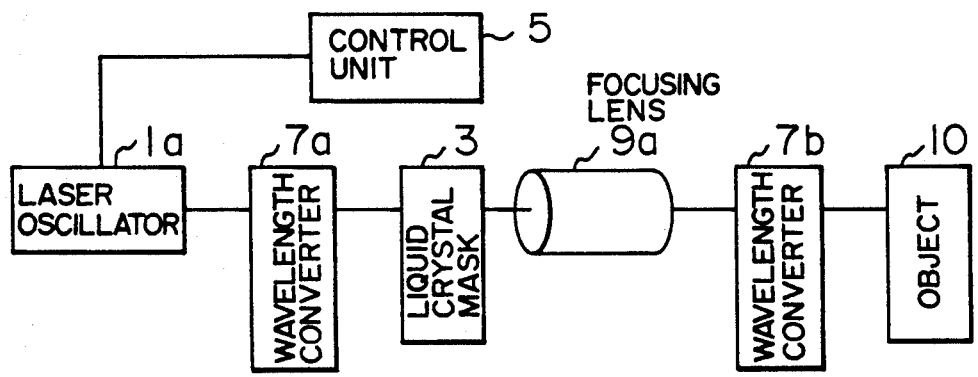

FIG. 7 shows an embodiment employing an excimer laser oscillator 1a.

The ultraviolet laser beam emitted from the excimer laser oscillator 1a is converted to a visible laser beam by a first wavelength converter 7a. The laser beam outgoing from the liquid crystal mask 3 is converted to an ultraviolet laser beam by a second wavelength converter 7b.

The pattern on the liquid crystal mask 3 is basically formed by dots. In a still further embodiment, in order to eliminate those portions which are disposed between dots and to which no laser beam is applied, the object to be worked may be oscillated at a minute amplitude.

Further, while the above embodiments have been described as being applied to a printed board coated with a photoresist, this should not be construed as restrictive. The object to be worked may also be a liquid crystal cells, a wafer, etc. Further, the laser beam applied to the object to be worked does not necessarily have to be an ultraviolet laser beam. Any type of laser beam will do as long as it has a wavelength to which the object to be worked reacts.

Figure 8:
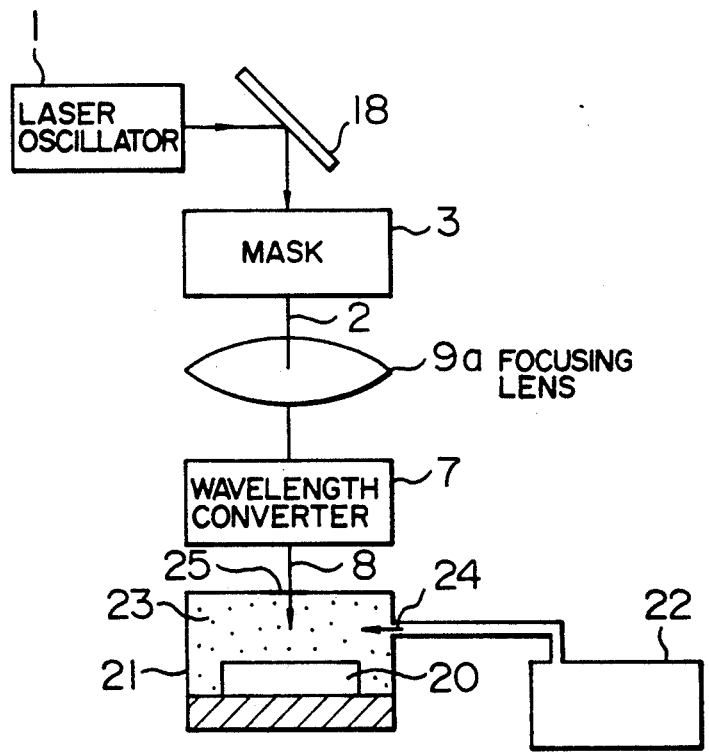
FIG. 8 is a schematic block diagram showing a further embodiment where this invention is utilized for the purpose of forming a metal film on a board.

In the embodiment shown in FIG. 8, the present invention is applied to the formation of a metal film on a semiconductor substrate, a printed board or the like where no photoresist is used.

Figure 9:
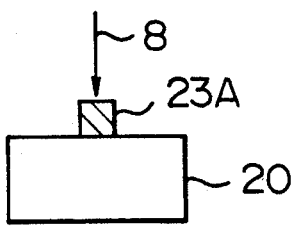
FIG. 9 is a sectional side elevation of the board on which a metal film has been formed.

A substrate 20, for example, is disposed within an airtight container 21 which communicates with a reactive gas chamber 22 filled with a gaseous chemical compound 24 of an evaporated metal 23. The airtight container 21 is supplied with the gaseous chemical compound 24. The gaseous chemical compound 24 may, for example, be tungsten hexafluoride ($WF_6$) or titanium tetrachloride ($TiCl_4$). The laser beam from the laser oscillator 1 is reflected at a right angle by a mirror 18 before it is applied to the liquid crystal mask 3. The visible laser beam 2 outgoing from the liquid crystal mask 3 and carrying pattern information passes through an image formation lens 9a and is applied to a wavelength converter 7 disposed in the vicinity of the focus of the image formation lens 9a. The wavelength converter 7 converts the beam to a ultraviolet laser beam 8 which is transmitted through a window 25 formed in the airtight container 21 and adapted to allow a transmission of the ultraviolet laser beam, and strikes upon the evaporated metal 23 in the airtight container 21. Then, as shown in FIG. 9, the evaporated metal 23 is activated to form on the substrate 20 a metal deposit 23A corresponding to the pattern information.

In a modification of this embodiment, a pattern information is impressed upon the object (for example, Si) to be worked which is disposed within the airtight chamber, by means of a reaction between an active gas (for example, $Cl_2$) and the ultraviolet laser beam.

What is claimed is:

1. A liquid crystal mask type laser marking system for transferring a pattern information onto an object to be worked, comprising:
    a laser oscillator adapted to emit one of an infrared laser beam and a visible laser beam;
    a liquid crystal mask which has a pattern mask and to which the laser beam from said laser oscillator is applied; and
    a wavelength converter for converting the laser beam outgoing from said liquid crystal mask to one having a wavelength to which the object to be worked is sensitive, and for applying the converted laser beam to said object to be worked.

2. A liquid crystal mask type laser marking system as claimed in claim 1, wherein said wavelength converter converts the laser beam from said liquid crystal mask to an ultraviolet laser beam.

3. A liquid crystal mask type laser marking system as claimed in claim 1, wherein the laser beam which has passed through said liquid crystal mask has two polarizing directions.

4. A liquid crystal mask type laser marking system as claimed in claim 3, further including a beam splitter for splitting said laser beam having two polarizing directions.

5. A liquid crystal mask type laser marking system as claimed in claim 1, further including a focusing lens arranged between said wavelength converter and said object to be worked.

6. A liquid crystal mask type laser marking system as claimed in claim 1, wherein said liquid crystal mask is a reflection type liquid crystal mask.

7. A liquid crystal mask type laser marking system as claimed in claim 1, further including a control unit which causes a pattern to be displayed on said liquid crystal mask and which, after the pattern display, causes the laser beam from said laser oscillator to be applied to said liquid crystal mask.

8. A liquid crystal mask type laser marking system as claimed in claim 1, further including scanning mirrors for applying the laser beam from said laser beam oscillator to said liquid crystal mask while scanning the mask with the beam.

9. A liquid crystal mask type laser marking system for transferring a pattern information onto an object to be worked, comprising:
    a laser oscillator adapted to emit one of an infrared laser beam and a visible laser beam;
    a liquid crystal mask which has a pattern mask and to which the laser beam from said laser oscillator is applied;
    a focusing lens for forming an image from the laser beam from said liquid crystal mask; and
    wavelength converter disposed in the vicinity of the focus of said focusing lens and adapted to convert the laser beam from said liquid crystal mask to one having a wavelength to which the object to be worked is sensitive, and to apply the converted laser beam to said object to be worked.

10. A liquid crystal mask type laser marking system as claimed in claim 9, wherein said wavelength converter converts the laser beam from said liquid crystal mask to an ultraviolet laser beam.

11. A liquid crystal mask type laser marking system as claimed in claim 9, wherein the laser beam which has passed through said liquid crystal mask has two polarizing directions.

12. A liquid crystal mask type laser marking system as claimed in claim 11, further comprising a beam splitter for splitting said laser beam having two polarizing directions.

13. A liquid crystal mask type laser marking system as claimed in claim 9, further including a control unit which causes a pattern to be displayed on said liquid crystal mask and which, after the pattern display, causes the laser beam from said laser oscillator to be applied to said liquid crystal mask.

14. A liquid crystal mask type laser marking system for transferring a pattern information onto an object to be worked, comprising:
    a laser oscillator adapted to emit an ultraviolet laser beam;
    a first wavelength converter for converting the ultraviolet laser beam from said laser oscillator to a visible laser beam;
    a liquid crystal mask to which the visible laser beam from said first wavelength converter is applied; and
    a second wavelength converter for converting the laser beam from said liquid crystal mask to an ultraviolet laser beam and for applying the converted laser beam to the object to be worked.

15. A liquid crystal mask type laser marking system as claimed in claim 14, wherein said laser oscillator is an excimer laser oscillator.

16. A liquid crystal mask type laser marking system as claimed in claim 14, wherein said second wavelength converter comprises non-linear elements and is directly arranged with respect to said liquid crystal mask in such a manner that, when the laser beam outgoing from said liquid crystal mask an having two polarizing directions that are perpendicular to each other is applied to said second wavelength converter, the two polarizing directions of this laser beam are respectively at fixed angles to the optical axis of the non-linear elements of said second wavelength converter, thereby providing a high wavelength conversion efficiency.

17. A liquid crystal mask type laser marking system as claimed in claim 14, wherein a focusing lens is disposed between said liquid crystal mask and said second wavelength converter.

18. A liquid crystal mask type laser marking system for transferring a pattern information onto a photoresist, which constitutes an object to be worked, and for exposing the transferred portions of the photoresist, comprising:
- a laser oscillator adapted to emit one of an infrared laser beam and a visible laser beam;
- a liquid crystal mask to which the laser beam from said laser oscillator is applied;
- a control unit which causes the pattern information to be displayed on said liquid crystal mask and which, after the information display, causes the laser beam from said laser oscillator to be applied to said liquid crystal mask; and
- a wavelength converter for converting the laser beam transmitted through said liquid crystal mask to an ultraviolet laser beam and for applying this ultraviolet laser beam to the object to be worked, i.e., the photoresist.

19. A liquid crystal mask type laser marking system as claimed in claim 18, further including a focusing lens for forming an image from the laser beam outgoing from said liquid crystal mask, said wavelength converter being disposed in the vicinity of the focus of said image formation lens.

20. A liquid crystal mask type laser marking system for transferring a pattern information onto an object to be worked, comprising:
- a container in which the object to be worked is disposed and which is filled with a reactive gas;
- a laser oscillator adapted to emit one of an infrared laser beam and a visible laser beam;
- a liquid crystal mask to which the laser beam from said laser oscillator is applied and which has a pattern mask; and
- a wavelength converter which converts the laser beam outgoing from said liquid crystal mask to an ultraviolet laser beam and which applies said ultraviolet laser beam to the inside of said container so as to transfer the pattern information onto said object to be worked by means of a reaction between said ultraviolet laser beam and said reactive gas.

21. A liquid crystal mask type laser marking system as claimed in claim 20, further including a focusing lens for forming an image from the laser beam outgoing from said liquid crystal mask, said wavelength converter being disposed in the vicinity of the focus of said focusing lens.

22. A liquid crystal mask type laser marking system as claimed in claim 20, wherein said container is an airtight container which has a window that allows the ultraviolet laser beam to be transmitted therethrough.

23. A liquid crystal mask type laser marking system as claimed in claim 1, wherein said wavelength converter comprises non-linear elements and is directionally arranged with respect to said liquid crystal mask in such a manner that, when the laser beam outgoing from said liquid crystal mask and having two polarizing directions that are perpendicular to each other is applied to said wavelength converter, the two polarizing directions of this laser beam are respectively at determined angles to the optical axis of the non-linear elements of said wavelength converter, thereby providing a high wavelength conversion efficiency.

24. A liquid crystal mask type laser marking system as claimed in claim 23, wherein a focusing lens is disposed between said wavelength converter and said object to be worked.

25. A liquid crystal mask type laser marking system as claimed in claim 23, wherein a focusing lens is arranged between said liquid crystal mask and said wavelength converter.

26. A liquid crystal mask type laser marking system as claimed in claim 9, wherein said wavelength converter comprises non-linear elements and is directionally arranged with respect to said liquid crystal mask in such a manner that, when the laser beam outgoing from said liquid crystal mask and having two polarizing directions that are perpendicular to each other is applied to said wavelength converter, the two polarizing directions of this laser beam are respectively at determined angles to the optical axis of the non-linear elements of said wavelength converter, thereby providing a high wavelength conversion efficiency.

27. A liquid crystal mask type laser marking system according to claim 26, wherein a focusing lens is disposed between said wavelength converter and said object to be worked.

28. A liquid crystal mask type laser marking system according to claim 26, wherein a focusing lens is arranged between said liquid crystal mask and said wavelength converter.

29. A liquid crystal mask type laser marking system according to claim 18, wherein said wavelength converter comprises non-linear elements and is directionally arranged with respect to said liquid crystal mask in such a manner that, when the laser beam outgoing from said liquid crystal mask and having two polarizing directions that are perpendicular to each other is applied to said wavelength converter, the two polarizing directions of this laser beam are respectively at determined angles to the optical axis of the non-linear elements of said wavelength converter, thereby providing a high wavelength conversion efficiency.

30. A liquid crystal mask type laser marking system according to claim 29, wherein a focusing lens is disposed between said wavelength converter and said object to be worked.

31. A liquid crystal mask type laser marking system according to claim 29, wherein a focusing lens is arranged between said liquid crystal mask and said wavelength converter.

32. A liquid crystal mask type laser marking system according to claim 20, wherein said wavelength converter comprises non-linear elements and is directionally arranged with respect to said liquid crystal mask in such a manner that, when the laser beam outgoing from said liquid crystal mask and having two polarizing directions that are perpendicular to each other is applied to said wavelength converter, the two polarizing directions of this laser beam are respectively at determined angles to the optical axis of the non-linear elements of said wavelength converter, thereby providing a high wavelength conversion efficiency.

33. A liquid crystal mask type laser marking system according to claim 32, wherein a focusing lens is disposed between said wavelength converter and said object to be worked.

34. A liquid crystal mask type laser marking system according to claim 32, wherein a focusing lens is arranged between said liquid crystal mask and said wavelength converter.

* * * * *